United States Patent
Onishi et al.

[11] Patent Number: 5,821,665
[45] Date of Patent: Oct. 13, 1998

[54] SURFACE ACOUSTIC WAVE DEVICE AND METHOD OF MANUFACTURE

[75] Inventors: Keiji Onishi, Settu; Shun-ichi Seki, Amagasaki; Yutaka Taguchi, Osaka; Kazuo Eda, Nara, all of Japan

[73] Assignee: Matsushita Electric Industrial Co., Ltd., Osaka, Japan

[21] Appl. No.: 646,716

[22] Filed: May 8, 1996

[30] Foreign Application Priority Data

May 8, 1995 [JP] Japan .................................... 7-109649

[51] Int. Cl.⁶ .................................................. H01L 41/08
[52] U.S. Cl. ...................................... 310/313 R; 310/344
[58] Field of Search ........................... 310/313 R, 313 A, 310/313 D; 33/150–155, 193–196

[56] References Cited

U.S. PATENT DOCUMENTS

| | | | |
|---|---|---|---|
| 4,270,105 | 5/1981 | Parker et al. | 310/313 A |
| 4,699,682 | 10/1987 | Takishima | 310/340 X |
| 5,448,126 | 9/1995 | Eda et al. | 310/313 A |
| 5,453,652 | 9/1995 | Eda et al. | 310/313 R |
| 5,471,722 | 12/1995 | Yatsuda | 310/344 X |

FOREIGN PATENT DOCUMENTS

| | | | |
|---|---|---|---|
| 0 622 897 A2 | 11/1994 | European Pat. Off. | |
| 4302171A1 | 7/1994 | Germany. | |
| 0202209 | 8/1990 | Japan | 310/344 |
| 0305013 | 12/1990 | Japan | 310/313 R |
| 5335878 | 12/1993 | Japan | 310/313 R |
| 7111438 | 4/1995 | Japan. | |

OTHER PUBLICATIONS (1) Kazuo Eda, Keiji Ohnishi et al., "Flip–Chip Bonding Technology Fabricates GHz–Band Saw Filters," JEE Journal of Electronic Engineering, No. 324, (Dec. 1993), 4 pp.
(2) European Search Report No. 96107281.6 (Sep. 5, 1996).

*Primary Examiner*—Mark O. Budd
*Attorney, Agent, or Firm*—Ratner & Prestia

[57] ABSTRACT

A compact, low height, low cost, and high reliability surface acoustic wave device, and its method of manufacture. The surface acoustic wave device consists of a substrate, a comb-electrode disposed on the main surface of the substrate, plural electrode pads disposed around the comb-electrode, protecting means covering the comb-electrode through a closed space produced by combining the comb-electrode and the electrode pads with the substrate by using substantially covalent bonding force acting between conductive bumps formed on the electrode bumps, a conductive adhesive layer disposed at least on the top of the conductive bumps, and a package adhered on the conductive bumps by means of the conductive adhesive, and insulation adhesive filled into the package contacting the conductive adhesive, the conductive bumps and the protective means.

13 Claims, 3 Drawing Sheets

SURFACE ACOUSTIC WAVE DEVICE AND METHOD OF MANUFACTURE

FIELD OF THE INVENTION

This invention relates to a surface acoustic wave device to be employed in mobile communication equipment or such.

BACKGROUND OF THE INVENTION

In accordance with the rapid development of mobile communication systems, a compact, low-height, high performance surface acoustic wave device which is one of the key devices constituting the communication equipment, is highly desired.

Although the wire-bonding method has been widely employed in assembling surface acoustic wave devices, the miniaturization of surface acoustic wave devices is limited because of the requirement for a large wire bonding land area. In addition to this, a short-circuit problem has often occurred which is caused by the introduction of conductive foreign objects such as solder particles on the unprotected comb electrode. Therefore, a new experimental face-down assembly method has been reported in Proceedings of the Japan IEMT Symposium (1993), pp. 109–112.

A structure of a conventional surface acoustic wave device assembled by means of said face-down method is explained by referring to FIG. 7 showing a cross-section of a conventional surface acoustic wave device. In FIG. 7, 201 is a substrate, 202 is a comb-electrode, 203 is an electrode pad, 204 is a conductive bump, 205 is a conductive adhesive, 206 is an insulating adhesive, 207 is a package, 208 is an electrode pattern, 209 is as external electrode, 210 is sealing, and 211 is a cover.

As shown in FIG. 7 for the conventional surface acoustic wave device, conductive bump 204 is disposed on electrode pad 203 which is disposed on substrate 201, conductive adhesive 205 is transfer-coated on conductive bump 204, and the device is assembled on electrode pattern 208 disposed on package 207 made of alumina, alumina-glass ceramics, or other materials by means of the face-down method in order to establish an external electrical connection.

In the structure of this device, since the adhesive strength between substrate 201 and package 207 is established only by conductive bump 204 and conductive adhesive 205, this is considered inadequate, and it is reinforced by providing an insulating adhesive 206.

However, in order to avoid any adverse effects on said surface-wave device, a method of applying a high-viscosity insulating adhesive 206 except in the peripheral region of said comb-electrode 202 has been employed in order to avoid the blocking of surface-wave propagation at the area around the comb-electrode 202.

However, although the assembling of the acoustic surface wave device by said face-down method is definitely advantageous for miniaturization of the device, since no wire bonding lands had to be provided, the exact control of the application of the insulating adhesive has been a difficult problem since there are chances of intrusion of insulating adhesive employed to reinforce the adhesive strength of the comb-electrode of the surface acoustic wave device. That is, since the assembly of a surface acoustic wave device has to be carried out under a strictly controlled environment to protect the comb-electrode against the intrusion of outside foreign objects, the application of conventional assembling technology has been difficult and thus impractical.

Thus, another conventional face-down bonding method used to assemble acoustic surface wave devices has been reported in Proceedings of the 1994 Ultrasonic Symposium (1994). pp. 159–162. That means that, without using the reinforcement of an insulation adhesive, the conductive bumps and the electrode disposed on the package are directly bonded by means of heat and ultrasonic energy thus holding the surface acoustic wave device only by means of conductive bumps. Since this is a method without the use of an insulating adhesive, the problems, including the intrusion of adhesive into said comb-electrode, can be eliminated.

However, another possible problem for the surface acoustic wave device is caused by the difference in the thermal stress produced by the thermal expansion coefficient between the surface acoustic wave device and the package. Therefore, the practical application of these face-down bonding methods having the advantage of achieving compact and low height packaging has been considered very difficult.

SUMMARY OF THE INVENTION

The goal of the present invention is to solve problems caused by using conventional assembly methods, and to achieve a compact and low height surface acoustic wave device, and at the same time, to offer a new manufacturing method for the new devices.

In order to accomplish these goals, the surface acoustic wave device according to the present invention consists of a substrate, a comb-electrode disposed on the main surface of said substrate, plural electrode pads disposed around said comb-electrode, protecting means covering said comb-electrode by means of a closed space produced by bonding said comb-electrode and said plural electrode pads with said substrate by utilizing substantially covalent bonding force there-between, conductive bumps formed oil said plural electrode bumps, a conductive adhesive layer disposed at least on the top of said conductive bumps, a package adhered on said conductive bumps by means of said conductive adhesive, and a package filled with said conductive adhesive contacting said conductive bumps, said protective means, and said package.

In, addition, the manufacturing method according to the present invention consists of forming a comb-electrode on a substrate, forming plural electrode pads around said comb electrode disposed on said substrate, bonding said substrate and said protecting means covering said comb-electrode and said plural pads by means of a closed space produced between said electrode pads and said comb-electrode by means of a substantially covalent bonding force, forming conductive bumps on said plural electrode pads, forming a conductive adhesive layer at least on the top of said conductive bumps, and bonding said conductive bumps onto an electrode pattern disposed on said package by means of said conductive adhesive, and contacting said conductive adhesive with said conductive bumps, said conductive adhesive layer, said protecting means, and said package.

The surface acoustic wave device and the manufacturing method therefor according to the present invention, result in a compact and low-height device easily attained by employing a face-down bonding method.

Since the package is filled with an insulating adhesive while protecting the comb-electrode by means of a protecting means, no viscosity adjustment of insulating adhesive has to be made, so that the coating process can be simplified and the manufacturing method of a surface acoustic wave device can be performed at lower cost. Moreover, since this is an assembling method without the use of heat or ultrasonic energy, there should be no chance of harming the characteristics of surface acoustic wave device.

Moreover, by combining the protective means with the substrate by means of a convalent bonding method, an acoustic surface wave derive of very high reliability without the chance of intrusion of conductive foreign material, water vapor, or such from outside can be obtained, and thus, a high frequency module incorporating another high-frequency device or plural surface acoustic wave devices can easily be obtained.

Since an air-tight sealing can be obtained by the protecting means, the assembly of a surface acoustic wave device is no longer required to be effected by mounting the acoustic surface device elements on the package means, thus a substantial reduction of the dimensions of a surface acoustic wave device is possible which, may contribute largely to the miniaturization of the device.

DETAILED DESCRIPTION OF THE INVENTION

The structures of the surface acoustic wave devices according to the present invention are now explained below by referring to the attached drawings.
Embodiment-1

Figure 1:
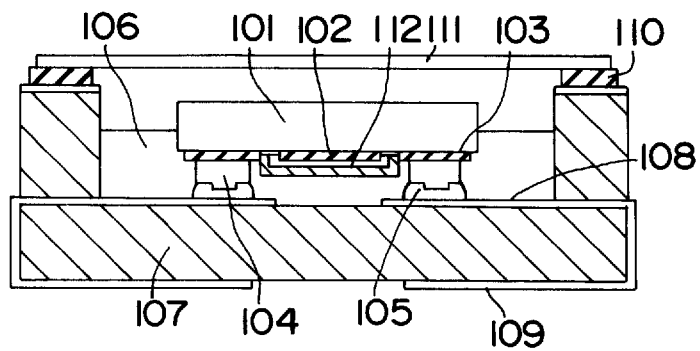
FIG. 1 is a schematic cross-section of a surface acoustic wave device of a first Embodiment according to the present invention.

FIG. 1 is a cross-section of a surface acoustic wave device according to Embodiment-1, showing its structure. In FIG. 1, 101 is a substrate, 102 is a comb-electrode, 103 is an electrode pad, 104 is a conductive bump, 105 is conductive adhesive, 106 is insulating adhesive, 107 is a package, 108 is an electrode pattern, 109 is an external electrode, 110 is sealing, 111 is a cover, and 112 is a protective means.

Figure 2:
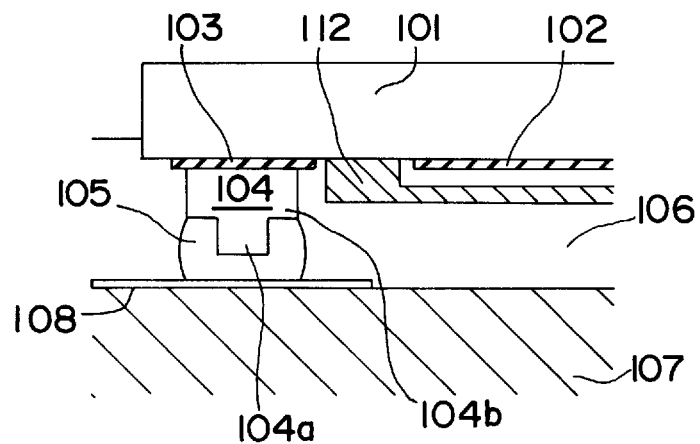
FIG. 2 is an enlarged portion of the cross-section of the surface acoustic wave device of FIG. 1 showing its structure at a peripheral part.

FIG. 2 is an enlarged portion of the cross-section of the surface acoustic wave device of Embodiment-1, showing its structure at the peripheral part.

In FIG. 2, 101 is a substrate, 102 is a comb-electrode, 103 is an electrode pad, 104a is a top of the conductive bump, 104b is a base of the conductive bump, 105 is conductive adhesive, 106 is insulating adhesive, 107 is a package, 108 is an electrode pattern, and 112 is a protective means.

In Embodiment-1, a 36° Y-cut X-propagation lithium tantalate crystal is used as substrate 101, comb-electrode 102 and electrode pad are made of metal thin film made mainly of gold patterned by using a conventional photolithographic method combined with a lift-off method. However, the substrate material to which the embodiments of the invention are applicable is not limited to the lithium tantalate crystal but is applicable to other crystals such as lithium niobate, quartz, lithium tetra-borate.

Embodiment-1 is characterized by direct bonding of protecting means 112 protecting said comb-electrode of the acoustic surface wave device onto substrate 101. As used herein, direct bonding means covalent bonding performed at a substantially atomic level in bonding two different substrates together.

The reason for employing the direct bonding, for Embodiment-1 is to obtain a high degree air-tightness at the periphery of the comb-electrode since the characteristics of an acoustic surface wave device are greatly influenced by the condition of the comb electrode. For example, the characteristics of a surface acoustic wave device deteriorate easily by moisture adsorbed in the comb electrode during the process of substrate dicing performed under conditions of poor air-tightness. Moreover, if the air-tightness is not maintained properly allowing the intrusion of moisture after the device is assembled, the device reliability would be lost because of the slow deterioration of device characteristics.

Therefore, the introduction of direct bonding technology enabling the bonding of two components at an atomic level, is essential in these embodiments, and by using this device, a highly reliable surface acoustic wave device would be realized.

Although the direct bonding is a bonding technology applicable for the bonding of two different substrates, a square single crystal substrate having a cut angle the same as that of substrate 101 is employed here as the material of protection means 112 in order to establish a crystallographic consistency with substrate 101.

This is because the characteristics of the acoustic surface wave device may well be influenced by the lattice distortion caused by the difference of lattice constants or residual stress caused by the different thermal expansion coefficients, since the direct bonding of substrates is performed at an atomic level. Furthermore, substrate 101 and protection means 112 shall preferably be of same materials since adequate bonding strength could not be obtained otherwise.

The manufacturing method of an acoustic surface-device according to the present invention is now explained below. An indentation having a depth of about 10 $\mu$m is formed on an area of protection means 112 facing comb-electrode 102 disposed on substrate 101 by using a fluoro-nitric acid system etchant providing a specific space to comb-electrode 102, thus ensuring free-propagation of an acoustic surface-wave.

Although only an example where the indentation is formed by a fluoro-nitric acid system etchant is shown here, a mechanical method such as sand-blasting may also be used to form the indentation. The depth of the indentation may be less than 10 $\mu$m considering the thickness of the comb-electrode 102 as long as the propagation of an acoustic surface-wave is not disturbed. The wall thickness of protection means 112, that is, bonding width 103 can be on the order of 250 $\mu$m.

Then, direct bonding of substrate 101 onto said protection means 112 is performed. After mirror-finishing the bonding face first, substrate 101 and protection means 112 are washed, a hydrophilic process using a mixed liquid of aqueous hydrogen peroxide and aqueous ammonia is applied to the assembly.

Then, substrate 101 and protection means 112 are aligned and pressed together. By this, bonding bounded by water molecules is established. Finally, the direct bonding process establishing a covalent bonding between substrate 101 and protection means 112 is ended by a heat treatment at about 200° C., thus expelling the water molecules remaining on the boundary.

Then conductive bumps 104 are deposited on electrode pads 103 disposed on the substrate by using a ball-bonding method employing gold wire. In this bump forming process, the employment of a wet-process such as electroplating is undesirable since surface acoustic wave device 101 is a device sensitive to water molecules, and instead it is desirable to employ a dry-process using gold bumps.

At the final process step, conductive bumps 104 are pressed on the mirror-finished base at a load of about 50 grams per bump in order to obtain plural conducting bumps having uniformly level tops.

FIG. 2 is an enlarged portion of the cross-section of the periphery of the structure showing said direct bonding. As shown in FIG. 2, the conductive bump 104 has a double-protrusion structure consisting of top 104a and base 104b. Top 104a of conductive bump 104 is immersed into a layer of a phenoxy-system thermo-plastic conductive adhesive in which silver-palladium alloy particles are dispersed, the adhesive is coated on a base of the bump in order to transfer the conductive adhesive layer 105 to top 104a of bump 104.

Then, substrate 101 is bonded face-down on electrode pattern 108 disposed on an alumina package 107 by means of the conductive adhesive layer 105. Since the embodiment shown in FIG. 2 is a bonding method without the application of heat or ultrasonic energy as shown in Proceedings on 1994 Ultrasonic Symposium, pp. 159–162, there should be no adverse effect from thermal stress or such on the characteristics of the surface acoustic wave device.

According to this embodiment of the invention, the height of base 104b of the conductive bump has to be set at a height slightly higher than the height of protective means 112 in order to permit the transfer of conductive adhesive layer 105 on top 104a of the conductive bump.

In this embodiment, the height of base 104b of said conductive bump is 50 μm and the thickness of said protecting means 112 is 40 μm. These dimensions are to avoid the chance of adhesion of conductive resin 105 on said protecting means 112, which is possible if the height of protecting means 112 is higher than the height of base 104b.

Moreover, although the silver-palladium alloy particles are used as a conductive filler of the conductive adhesive in this embodiment, metal filler particles of other types may be used. In addition to this, although phenoxy-system thermo-plastic conductive adhesive is used as a binder of the conductive adhesive here, a silicon or epoxy resin system thermo-setting adhesive can be used as well.

Since adequate mechanical strength for holding substrate 101 can not be obtained by means of conductive bump 104 and conductive adhesive 105 only, insulating resin 106 is used to completely fill the space provided between the protecting means which is directly bonded on said substrate 101 and the package 107 in order to reinforce the adhesion strength by utilizing the shrinkage stress due to hardening. Though a silicon system thermo-setting adhesive is used as an insulating resin 106 in this embodiment, needless to say that the same effect can also be obtained by using an epoxy system thermo-setting adhesive.

In this embodiment of the invention, since a space is provided on the comb-electrode of substrate 101 by means of the indentation of protecting means 112, this can be filled completely with low-viscosity insulating adhesive without adjustment of its viscosity. Since productivity can be improved and the introduction of foreign material during the assembly process can be prevented, not only a higher production yield but a lower production cost can be obtained.

As explained above, the surface acoustic wave device according to the invention consists of a comb-electrode formed on the main surface of said substrate, plural electrode pads disposed on the periphery of the comb-electrode, a protection means covering the comb-electrode through a space formed by the substantially covalent bonding established between the comb-electrode and the plural electrode pads, conductive bumps formed the top of the plural electrode pads, conductive adhesive disposed at least on top of the conductive bumps, a package adhered on the conductive bumps by means of the conductive adhesive, and insulating adhesive contacting the conductive adhesive, the conductive bumps, and the protection means filling the package.

By this, the practical employment of a face-down system assembly method is used resulting in easily obtaining a compact and low-height surface acoustic wave device.

This means, while the viscosity adjustment of the insulating resin and its coating process had been difficult in manufacturing a surface acoustic wave device by the conventional method, with the method of the invention using the protection means filled completely with low viscosity insulating resin, the production yield can be substantially improved and the production cost can be considerably reduced. Furthermore, by providing the protection means, the chance of introduction of foreign materials into the comb electrode part during the assembly process can be completely eliminated.

Moreover, as shown in this embodiment, the effect of thermal stress caused by a difference in the thermal expansion coefficients between the substrate and the protection means can be eliminated by employing a single-crystal substrate having a cut that is the same as that of the substrate, so that a surface acoustic wave device having excellent frequency characteristics can be obtained.

Embodiment-2

Figure 3:
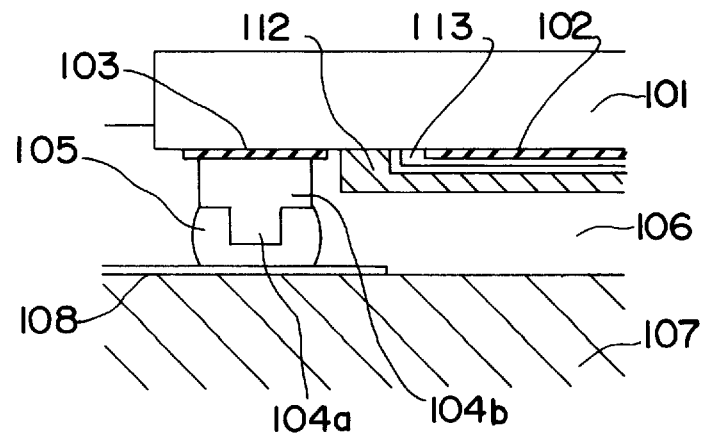
FIG. 3 is an enlarged portion of the cross-section of the surface acoustic wave device in accord with a second Embodiment of the invention, showing its structure at a peripheral part.

FIG. 3 shows a cross-section of the surface acoustic wave device of Embodiment-2 of the invention, showing particularly a structure of the device assembled on a substrate. In FIG. 3, 101 is a substrate, 102 is a comb-electrode, 103 is an electrode pad, 104a is the top of conductive bump, 104b is the base of said conductive bump, 105 is conductive adhesive, 106 is insulating adhesive, 107 is a package, 108 is an electrode pattern, 112 is a protection means, and 113 is an insulating protection layer.

As in the case of Embodiment-1, a 36° Y-cut X propagation lithium tantalate crystal is used as substrate 101 and protection means 112 also. However, a similar effect can be obtained by using a single crystal substrate of lithium niobate, quartz crystal, lithium borate, or such. On the other hand, comb-electrode 102 and electrode pads 103 of aluminum alloy thin film are formed by using a conventional photolithographic method. Then, a metal thin film employed as a protection layer is deposited on the periphery of comb-electrode 102 over the wiring pattern excluding electrode pads 103 and comb-electrode 102. A silicon oxide layer about 8000 Å thick acting as an insulating protection layer is deposited using a sputtering method. Silicon may be used instead of silicon oxide as a material for insulating protection layer 113.

As in the case of Embodiment-1, an indentation is provided on protection means 112 at an area facing comb-electrode 102 disposed on substrate 101 by using a fluoro-nitric acid system etchant. The direct bonding of substrate 101 onto protection means 112 is performed using the method shown in Embodiment-1.

When a comb-electrode made of aluminum alloy thin film is used as in the case of Embodiment-2, the surface of comb-electrode 102 is corroded in the hydrophilic processing used for direct bonding. However, the corrosion of comb-electrode 102 can be prevented by depositing insulating protection layer 113 around comb-electrode 102, so that the direct bonding process can be performed even in a case where the comb-electrode 102 is made of an aluminum alloy.

Then, conductive bumps 104 are disposed on electrode pads 103 formed on substrate 101 by a ball-bonding method using sold wire, and conductive adhesive 105 is transfer-coated on the conductive bumps 104 after leveling the height of the bumps. After this, substrate 101 is bonded thereon face-down by using conductive adhesive 105. Since the bonding strength realized by using conductive bump 104 and conductive adhesive 105 only, is inadequate to hold down substrate 101, insulating resin 106 is filled in the between package 107 and protecting means 112 bonded directly on substrate 101 in order to supplement the adhesive strength by using the stress of insulating resin 106 from hardening.

In this process, since comb-electrode 102 disposed on substrate 101 is protected by the space secured by the indentation of protecting means 112, filling can be made without viscosity adjustment of insulating resin in the case of conventional face-down bonding, and the space filled completely by the low-viscosity insulating adhesive, productivity of the device can be improved considerably. Furthermore, since comb-electrode 102 is covered by insulating protection layer 113, it can be bonded directly onto the protecting means even when it is made of metal thin film such as aluminum alloy which is eroded easily, so that the introduction of conductive foreign objects in the assembling process can be prevented and the production yield of the device can be improved.

As described above, the surface acoustic wave device of Embodiment-2 consists of a substrate, comb-electrode disposed on the main surface of the substrate, plural electrode pads disposed on the periphery of the comb-electrode, insulating protection layer disposed on the comb-electrode, protecting means covering the comb-electrode enclosing a space produced by a substantially covalent bonding established between the substrate the comb-electrode and the electrode pads, conductive bumps disposed on the plural electrode pads, conductive adhesive disposed at least on the top of said conductive bumps, a package adhered to said conductive bumps by means of said conductive adhesive, and insulating adhesive filled to contact the conductive bumps, the protecting means, and the package. By this, face-down system bonding can be applied even when the comb-electrode is made of an aluminum alloy which is easily corroded, thus easily obtaining a compact and low profile surface acoustic wave device.

This means that the viscosity adjustment and coating of insulating resin which had been difficult in the conventional process used to assemble the surface acoustic wave device is eliminated, and low viscosity insulating resin is filled in the space provided below the protecting means so that the production yield can be higher while the production cost can be lowered. By providing the protecting means, introduction of conductive foreign objects during the assembling process can be prevented.

As in the case of Embodiment-2, by using a protecting means made of a single crystal substrate having a cut angle same as that of the substrate, the thermal stress due to the difference in the thermal expansion coefficients between the substrate and the protecting means can be eliminated so that a surface acoustic wave device of excellent frequency characteristics can be obtained.

Embodiment-3

Figure 4:
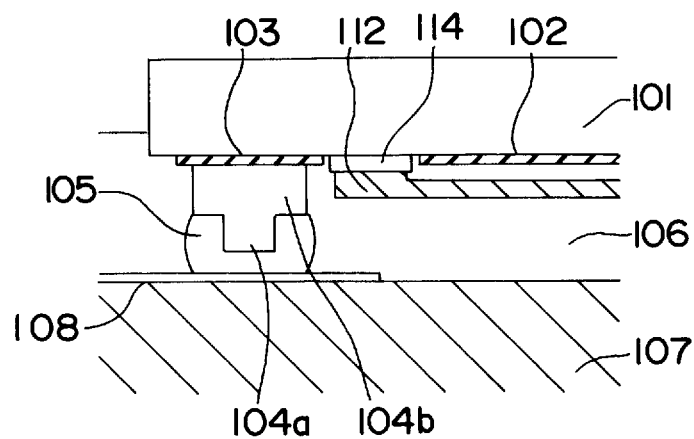
FIG. 4 is an enlarged portion of the cross-section of the surface acoustic wave device in accord with a third Embodiment showing its structure at a peripheral part.

FIG. 4 is an enlarged portion of the cross-section of the surface acoustic wave device of Embodiment-3 according to the present invention, and showing particularly a structure of the device assembled on the substrate. In FIG. 4, 101 is a substrate, 102 is a comb-electrode, 103 is an electrode pad, 104a is a top of conductive a bump, 104b is a base of the conductive bump, 105 is a conductive adhesive, 106 is insulating adhesive, 107 is a package, 108 is an electrode pattern, 112 is a protecting means, and 113 is an insulation layer.

In Embodiment-3, as in the case of Embodiment-1, 36° Y-cut X-propagation lithium tantalate crystals are used both as substrate 101, and protection means 112. However, similar effects can be obtained by employing a single crystal substrate of lithium niobate, quartz crystal, lithium borate, or the like. On the other hand, comb-electrode 102 and electrode pads 103 of metal thin film made mainly of gold are formed by using a conventional photolithographic (lift-off) method. Furthermore, a silicon oxide layer about 1 μm thick as an insulation layer 114 is deposited on the area of direct bonding by a sputtering method. Silicon can be used instead of silicon oxide as a material of insulation layer 114. The thickness of insulation layer 114 is much thicker than that of comb-electrode 102 so that the step of the wiring electrode is adequately covered.

By employing an adequately thick insulation layer 114, the stress effected on the substrate can be relieved. That is, the stress produced at the direct bonding can be relieved so that the negative effect of stress on the characteristics of a surface acoustic wave device can be eliminated.

In order not to disturb the propagation of a surface-wave, an indentation is provided on protecting means 112 on a part facing comb-electrode 102 of substrate 101 by using a fluoro-nitric acid system etchant. Here, the direct bonding of substrate 101 onto protecting means 112 is performed by the method shown in Embodiment-1.

The direct bonding in Embodiment-3 is effected at the boundary between the 36° Y-cut X-propagation lithium tantalate crystal comprising the protecting means and the silicon oxide layer comprising the insulation layer. Since the direct bonding is fundamentally a technology applicable to the bond of different materials, an excellent bonding can be obtained in this case where the components of same-materials are bonded as in the case of Embodiment-1.

Although not shown in the drawing, there should be a region where a wiring pattern exists between the comb-electrode 102 of the surface acoustic wave device and the electrode pad 103. In this case, therefore, there should be a step or a gap between the wiring part and none-wiring part so that a perfect hermetic seal equivalent to direct bonding can not be obtained. Therefore, when this step can be a problem, the protecting means is directly bonded after insulating layer 114 is leveled out by applying a chemical and mechanical polishing, securing a higher degree of hermetic sealing. In this case, the conventional package would be not be required, producing a more compact surface acoustic wave device at a lower-cost.

In Embodiment-3, though a single crystal substrate same as the substrate on which the surface acoustic wave device is constricted is utilized as the protecting means, a glass substrate having a thermal expansion coefficient the same as at that of the substrate on which the surface acoustic wave device is disposed enabling the use of direct bonding to the insulation layer. Moreover, a quartz crystal substrate easily bondable to the insulation layer made of silicon oxide may be used.

Then, conductive bumps 104 are formed on electrode pad 103 disposed on substrate 101 by a ball-bonding method using gold wire, and conductive adhesive 105 is transfer-coated on the conductive bumps 104 after leveling the height of the bumps. After this, substrate 101 is bonded face-down by using conductive adhesive 105. Since the bonding strength realized by using only conductive bump 104 and conductive adhesive 105 is not adequate to hold down substrate 101, insulating resin 106 is filled in the space provided between package 107 and holding substrate 112 bonded directly on substrate 101 in order to fortify the adhesive strength by utilizing the stress of insulating resin 106 created during hardening.

In Embodiment-3, since comb-electrode 102 disposed on substrate 101 is provided with an indentation formed on protecting means 112, the conventionally needed viscosity adjustment of the insulating adhesive is not necessary, and the space is filled completely with the low-viscosity insulating adhesive.

As described above, the surface acoustic wave device of the invention consists of a substrate, a comb-electrode disposed on the main surface of the substrate, plural electrode pads disposed on the periphery of the comb-electrode, insulating protection layer disposed on the comb-electrode surrounding the comb-electrode between the comb-electrode and the electrode pads, protecting means covering the comb-electrode enclosing a space produced by performing substantially covalent bonding of the substrate to the comb-electrode and the electrode pads, conductive bumps disposed on the electrode pads, conductive adhesive disposed at least on the top of the conductive bumps, a package adhered on the conductive bumps by the conductive adhesive, and insulating adhesive filled to contact the conductive bumps, the protecting means, and the package. By this, the face-down bonding system can be applied even when the comb-electrode is made of an easily corroded aluminum alloy to easily obtain a compact and low profile surface acoustic wave device.

That is, with the conventional process used to assemble the surface acoustic wave device, the viscosity adjustment and the coating processes of insulating resin has been difficult. These can be eliminated by using a low viscosity insulating resin filling in the space provided under the protecting means so that a higher production yield while a lower production cost can be obtained. By providing the protecting means, introduction of conductive foreign material during the assembly process can be completely prevented.

Since the thermal stress due to the difference in the thermal expansion coefficients between the substrate and the protecting means can be absorbed in this embodiment, a surface acoustic wave device having excellent frequency characteristics can also be obtained.

Moreover, the conventionally needed package can be eliminated since the sealing of the comb-electrode is realized by the protecting means and by leveling the insulation layer.

Embodiment-4

Figure 5:
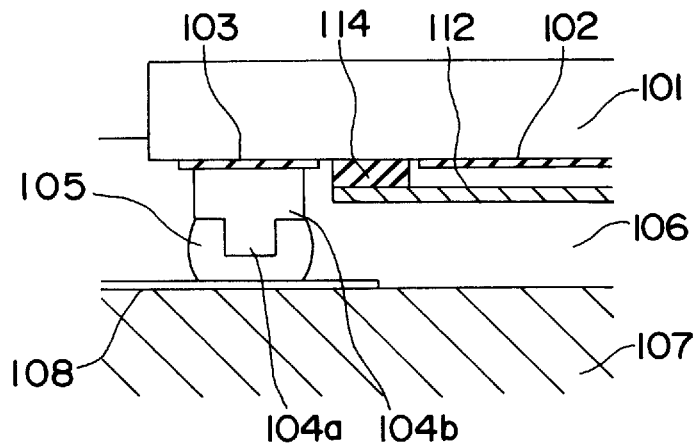
FIG. 5 is an enlarged portion of the cross-section of the surface acoustic wave device in accord with a fourth Embodiment of the invention showing its structure at a peripheral part.

FIG. 5 is an enlarged partial cross-section of the surface acoustic wave device of Embodiment-4 according to the invention, showing particularly a structure of the device assembled on the substrate. In FIG. 5, 101 is a substrate, 102 is a comb electrode, 103 is an electrode pad, 104a is a top of conductive bump, 104b is a base of the conductive bump, 105 is conductive adhesive, 106 is insulating adhesive, 107 is a package, 108 is an electrode pattern, 112 is a protecting means, and 114 is an insulation layer.

In Embodiment-4, as in the case of Embodiment-1, 36° Y-cut X-propagation lithium tantalate crystals are used as substrate 101 and protection means 112. However, same effects could be obtained by employing a single crystal substrate of lithium niobate, quartz, lithium borate, or the like. On the other hand, comb electrode 102 and electrode pads 103 made of metal thin film made mainly of gold are formed by using a conventional photolithographic (lift-off) method. Furthermore, a patterned silicon oxide layer acting as an insulation layer surrounding comb-electrode is deposited on substrate 101 and this acts as a spacer in order to prevent disturbance of the propagation of a surface-wave.

Here, the insulation layer is deposited in a thickness of about 2 $\mu$m which is considerably thicker than the thickness of the comb-electrode. Though a sputtering method is used to deposit the silicon oxide pattern here, a coated type insulation layer may be used because of an excessive sputtering period. The direct bonding between substrate 101 and protecting means 112 on which insulation layer 114 is deposited is performed by the method described in Embodiment-3. Since the direct bonding in Embodiment-4 is performed at the boundary between the 36° Y-cut X-propagation lithium tantalate crystal and the insulation layer deposited on the protecting means, excellent bonding can be obtained as in the case of Embodiment-1.

Although a single crystal substrate identical with the substrate on which the surface acoustic wave device is constructed is used as a protecting means, a glass substrate having a thermal expansion coefficient same as that of surface acoustic wave device and a high bondability to said insulation layer may be used as well. Moreover, a quartz crystal substrate having a thermal expansion coefficient same as that of the insulation layer made of silicon oxide may also be used.

In Embodiment-4, a flat plate type protecting means 112 is used, a space facing the comb-electrode is automatically provided by means of insulation layer 114 and no indentation has to be provided on protecting means 112, thus the production cost can be reduced further.

Next, conductive bumps 104 are formed on electrode pad 103 disposed on substrate 101 by a ball-bonding method using gold wire, and conductive adhesive 105 is transfer-coated on the conductive bumps 104 after leveling the heights of the bumps. After this, substrate 101 is bonded face-down by using conductive adhesive 105. Since the bonding strength obtained by conductive bump 104 and conductive adhesive 105 only is not adequate to hold down substrate 101, insulating resin 106 is filled in the space provided between package 107 and substrate 101 in order to fortify the adhesive strength by utilizing the shrinkage stress of insulation resin 106 created during hardening.

In Embodiment-4, since comb-electrode 102 disposed on substrate 101 is provided with an indentation formed on protecting means 112, the conventionally used viscosity adjustment of the insulation adhesive is not necessary, and the space is filled completely with the low-viscosity insulation adhesive.

As described above, the surface acoustic wave device of the invention consists of a substrate, a comb-electrode disposed on the main surface of the substrate, plural electrode pads disposed on the periphery of the comb-electrode, an insulation layer disposed on the comb-electrode surrounding the comb-electrode between the comb-electrode and the electrode pads, a protecting means covering the comb-electrode enclosing a space produced by performing a substantially covalent bonding of the substrate to the comb-electrode and the electrode pads, conductive bumps disposed on the electrode pads, conductive adhesive disposed at least on the top of the conductive bumps, a package adhered on the conductive bumps by means of the conductive adhesive, and an insulation adhesive filled to contact with the conductive bumps, the protecting means, and the package. By this method, a face-down system bonding is used to easily attain a compact and low profile surface acoustic wave device.

That is, with the conventional process used to assemble the surface acoustic wave device, the viscosity adjustment and the coating processes of insulating resin has been difficult. Those problems can be eliminated by using a low viscosity insulating resin filling the space provided under the protecting means. Therefore, the production yield can be higher while the production cost can be lower. By providing the protecting n means, introduction of conductive foreign objects during the assembly process can be completely prevented.

Since the flat-plate shaped protecting means is realized by depositing a thick insulating means, the process used to provide an indentation can be eliminated, reducing further the production cost and expanding the range of choice of substrate materials.

Moreover, like the present embodiment of the invention, by providing a thick insulation layer, the thermal stress due to the difference in the thermal expansion coefficients between the substrate and the protecting means can be absorbed in this embodiment, a surface acoustic wave device of excellent frequency characteristics can be obtained.

Moreover, by disposing a thick insulating means at the direct bonding part of the substrate and by leveling the insulating means, better sealing of the comb-electrode can be obtained by the protecting means only. In this case, the conventional package can be eliminated, realizing a more compact surface acoustic wave device at a still lower cost.

Embodiment-5

Figure 6:
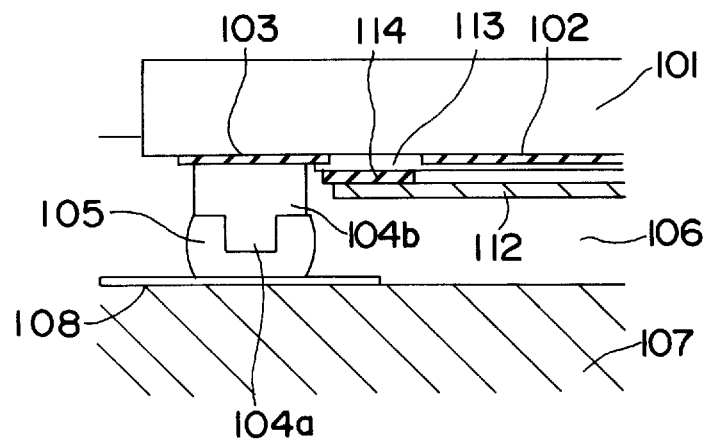
FIG. 6 is an enlarged portion of the cross-section of the surface acoustic wave device in accord with a fifth Embodiment of the present invention showing its structure at a peripheral part.
Figure 7:
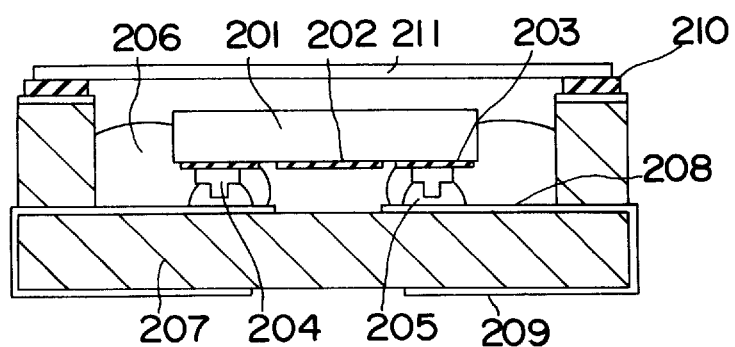
FIG. 7 shows a cross-section of the structure of a conventional surface acoustic wave device.

FIG. 6 is an enlarged partial cross-section of the acoustic surface-wave device of Embodiment-5 of the invention, and showing particularly a schematic structure of the device assembled on the substrate. In FIG. 6, 101 is a substrate, 102 is a comb-electrode, 103 is an electrode pad, 104a is a top of conductive bump, 104b is a base of said conductive bump, 105 is a conductive adhesive, 106 is an insulating adhesive, 107 is a package, 108 is an electrode pattern, 112 is a protecting means, 113 is an insulating protection means, and 114 is an insulation layer.

In Embodiment-5, 41° Y-cut X-propagation lithium niobate crystals are used as substrate 101 and protection means 112. On the other hand, comb electrode 102 and electrode pads 103 made of metal thin film made mainly of an aluminum alloy are formed by using a conventional photolithographic method. Furthermore, insulating protection layer 113 is formed on an area where no metal thin film acting as a protecting layer is formed on the electrode region made of aluminum alloy, that is, surrounding the direct bonding area and comb-electrode 102. By this, the possible corrosion of comb-electrode 102 during the direct bonding process is prevented, so that the application of direct bonding is possible even when a comb-electrode made of aluminum alloy is used.

An air-tight sealing can be obtained when the protecting means is bonded directly onto insulation layer 114 after its leveled out by applying a mechanical polishing. Moreover, a pattern of silicon oxide insulation layer acting as a spacer surrounding said comb-electrode 102 is disposed on a part of substrate 101 facing comb-electrode 102 in order not to disturb the propagation of an acoustic surface-wave.

Here forming the silicon oxide layer, like in Embodiment-4, a sputtering method is used. The direct bonding of substrate 101 and protecting means 112 on which insulation layer 114 is disposed is performed by the method described in Embodiment-3. Though the direct bonding shown in Embodiment-5 is performed at a boundary between the insulation protecting layer formed on a 41° Y-cut X-propagation lithium niobate crystal acting as a substrate and the insulation layer formed on said protecting means, excellent bonding like that in Embodiment-1 can be obtained.

Though In Embodiment-5, a single crystal substrate identical with the substrate on which the surface acoustic wave device is constructed is used as a protecting means, a glass substrate having a thermal expansion coefficient same as that of surface acoustic wave device substrate and high bondability to said insulation layer may be used as well. Moreover, a quartz crystal substrate having a thermal expansion coefficient the same as that of said insulation layer made of silicon oxide may also be used.

Next, conductive bumps 104 are formed on electrode pad 103 disposed on substrate 101 by a ball-bonding method using gold wire, and conductive adhesive 105 is transfer-coated on said conductive bumps 104 after leveling the heights of the bumps. After this, substrate 101 is bonded face-down by using conductive adhesive 105. Since the bonding strength attainable by conductive bump 104 and conductive adhesive 105 only is not adequate to hold down substrate 101, insulating resin 106 is filled in the space provided between package 107 and substrate 101 in order to increase the adhesive strength by utilizing the shrinkage stress of insulating resin 106 created during hardening.

In Embodiment-4, since comb-electrode 102 disposed on substrate 101 is provided with the indentation formed on protecting means 112, the conventional viscosity adjustment of the insulating adhesive is unnecessary, and the space can be filled completely with the low-viscosity insulating adhesive.

As described above, the surface acoustic wave device of the invention consists of a substrate, a comb-electrode disposed on the main surface of the substrate, plural electrode pads disposed on the periphery of the comb-electrode, an insulating protection layer disposed on the comb-electrode, an insulating layer disposed surrounding the comb-electrode between the comb-electrode and the electrode pads, a flat protecting means covering the comb-electrode through a space produced by performing a substantially covalent bonding of the substrate to the insulating means, conductive bumps disposed on the electrode pads, conductive adhesive disposed at least on the top of the conductive bumps, a package adhered on the conductive bumps by means of the conductive adhesive, and an insulating adhesive filled to contact the conductive bumps, the protecting means and the package. By this method, the face-down bonding system is applied thus easily attaining a compact low profile surface acoustic wave device.

This means that, with the conventional process used to assemble the surface acoustic wave device, the viscosity adjustment and the coating processes of insulating resin which were left as difficult problems, these can be eliminated completely by using a low viscosity insulating resin filling the space provided under the protecting means so that a higher production yield while a lower production cost can be obtained. By providing the protecting means, induction of conductive foreign particles during the assembling process can be prevented.

Moreover, since a flat plate-shaped protecting means can be realized by depositing a thick insulating means, the process to provide an indentation on said protecting means can be eliminated further reducing the production cost and expanding the range of choice of substrate materials.

In addition to these, like the present embodiments of the invention, by providing a thick insulation layer, the thermal stress produced by the difference in the thermal expansion coefficients between the substrate and the protecting means can be absorbed, so that a surface acoustic wave device of excellent frequency characteristics can be produced.

Furthermore, by depositing an insulation layer on the direct bonding region of the substrate and leveling the insulation layer, a high degree of sealing of the comb-electrode can be obtained by the protecting means only. In this case, the conventional package becomes unnecessary resulting in a more compact and lower cost surface acoustic wave device.

What is claimed:

1. A surface acoustic wave device comprising:

a comb-electrode formed on a main surface of a substrate, plural electrode pads disposed on the periphery of said comb-electrode, protection means covering said comb-electrode through a space formed by a substantially covalent bonding established between said protection means and said substrate in an area of said substrate between said comb-electrode and said plural electrode pads, conductive bumps formed on the tops of said plural electrode pads, said conductive bumps consisting of a base bonded to said electrode pad and a protrusion formed on said base, wherein a height of said base is higher than a height of said protection means, a conductive adhesive layer disposed at least on the tops of said conductive bumps, a package adhered on said conductive bumps by means of said conductive adhesive, and insulating adhesive contacting with said conductive adhesive, said conductive bumps, and said protection means, filling said package.

2. A surface acoustic wave device according to claim 1, wherein an indentation is provided in said protecting means at a region facing said comb-electrode region.

3. A surface acoustic wave device according to claim 1, wherein said protecting means consists of a single crystal being the same as that of said substrate.

4. A surface acoustic wave device according to claim 1, wherein an insulating protection layer is formed on said comb-electrode.

5. A surface acoustic wave device according to claim 1, wherein said insulating protection means consists of an inorganic material of either silicon or silicon oxide.

6. A surface acoustic wave device comprising:

a comb electrode formed on the main surface of an insulating layer, electrode pads disposed on the periphery of said comb-electrode, an insulating layer formed to surround said comb-electrode at an area between said comb-electrode and said plural electrode pads, protection means covering said comb-electrode through a space formed by a substantially covalent bonding established between said protection means and said insulating layer in an area of said insulating layer between said comb-electrode and said plural electrode pads, conductive bumps formed on the tops of said electrode pads, said conductive bumps consisting of a base bonded to said electrode pad and a protrusion formed on said base, wherein a height of said base is higher than a height of said protection means, a conductive adhesive layer disposed at least on the tops of said conductive bumps, a package adhered on said conductive bumps by means of said conductive adhesive, and an insulating adhesive contacting with said conductive adhesive, said conductive bumps, and said protection means, filling said package.

7. A surface acoustic wave device according to claim 6, wherein said insulation layer is made of an inorganic material of either silicon or silicon oxide.

8. A surface acoustic wave device according to claim 6, wherein an indentation is provided on said protecting means at an area facing said comb-electrode.

9. A surface acoustic wave device according to claim 6, wherein said protection means is made of a single crystal being the same as that of said substrate.

10. A surface acoustic wave device according to claim 6, wherein said protection means is made of either quartz or glass.

11. A surface acoustic wave device according to claim 6, wherein an insulating protection layer is formed on said comb-electrode.

12. A surface acoustic wave device according to claim 11, wherein said insulating protection layer is made of inorganic material of wither silicon or silicon oxide.

13. A surface acoustic wave device comprising:

a comb-electrode formed on a main surface of a substrate, plural electrode pads disposed on the periphery of said comb-electrode, protection means covering said comb-electrode through a space formed by a substantially covalent bonding established between said protection means and said substrate in an area of said substrate between said comb-electrode and said plural electrode pads, conductive bumps formed on the tops of said plural electrode pads, wherein a height of said conductive bumps is higher than a height of said protection means, a conductive adhesive layer disposed at least on the tops of said conductive bumps, a package adhered on said conductive bumps by means of said conductive adhesive, and insulating adhesive contacting with said conductive adhesive, said conductive bumps, and said protection means, filling said package.

* * * * *